United States Patent
Kawai

(10) Patent No.: US 10,375,867 B2
(45) Date of Patent: Aug. 6, 2019

(54) ELECTRONIC DEVICE AND METHOD FOR PRODUCING SAME

(71) Applicant: OMRON CORPORATION, Kyoto-shi, Kyoto (JP)

(72) Inventor: Wakahiro Kawai, Konan (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/756,114

(22) PCT Filed: Mar. 27, 2017

(86) PCT No.: PCT/JP2017/012469
§ 371 (c)(1),
(2) Date: Feb. 28, 2018

(87) PCT Pub. No.: WO2017/187865
PCT Pub. Date: Nov. 2, 2017

(65) Prior Publication Data
US 2018/0255667 A1  Sep. 6, 2018

(30) Foreign Application Priority Data
Apr. 27, 2016 (JP) ................. 2016-089369

(51) Int. Cl.
*H05K 9/00* (2006.01)
*H01L 23/00* (2006.01)
(Continued)

(52) U.S. Cl.
CPC .......... *H05K 9/0084* (2013.01); *H01L 23/00* (2013.01); *H01L 23/552* (2013.01);
(Continued)

(58) Field of Classification Search
CPC .... H05K 9/0084; H05K 1/185; H05K 1/0218; H05K 5/04; H05K 3/125; H05K 1/189;
(Continued)

(56) References Cited

U.S. PATENT DOCUMENTS

| 5,298,684 A | 3/1994 | Leeb |
| 2006/0067070 A1 | 3/2006 | Otsuki |

(Continued)

FOREIGN PATENT DOCUMENTS

| CN | 101740550 A | 6/2010 |
| CN | 102315199 A | 1/2012 |

(Continued)

OTHER PUBLICATIONS

An English translation of the International Search Report (ISR) of PCT/JP2017/012469 dated Jun. 20, 2017.

(Continued)

*Primary Examiner* — Steven T Sawyer
*Assistant Examiner* — Sagar Shrestha
(74) *Attorney, Agent, or Firm* — Metrolex IP Law Group, PLLC

(57) ABSTRACT

The present invention provides an electronic device which includes an electromagnetic shield, can keep down a production cost, can be made to have a reduced thickness, and has a high degree of freedom in designing a wiring circuit. Further, the present invention provides a method for producing such an electronic device. The electronic device (1A) includes at least one high frequency functional component (21), an electrically conductive member (10) which electromagnetically shields the at least one high frequency functional component (21), and a resin molded body (23) in which at least part of the high frequency functional component (21) and at least part of the electrically conductive member (10) are embedded and fixed.

10 Claims, 6 Drawing Sheets

Figure 1:
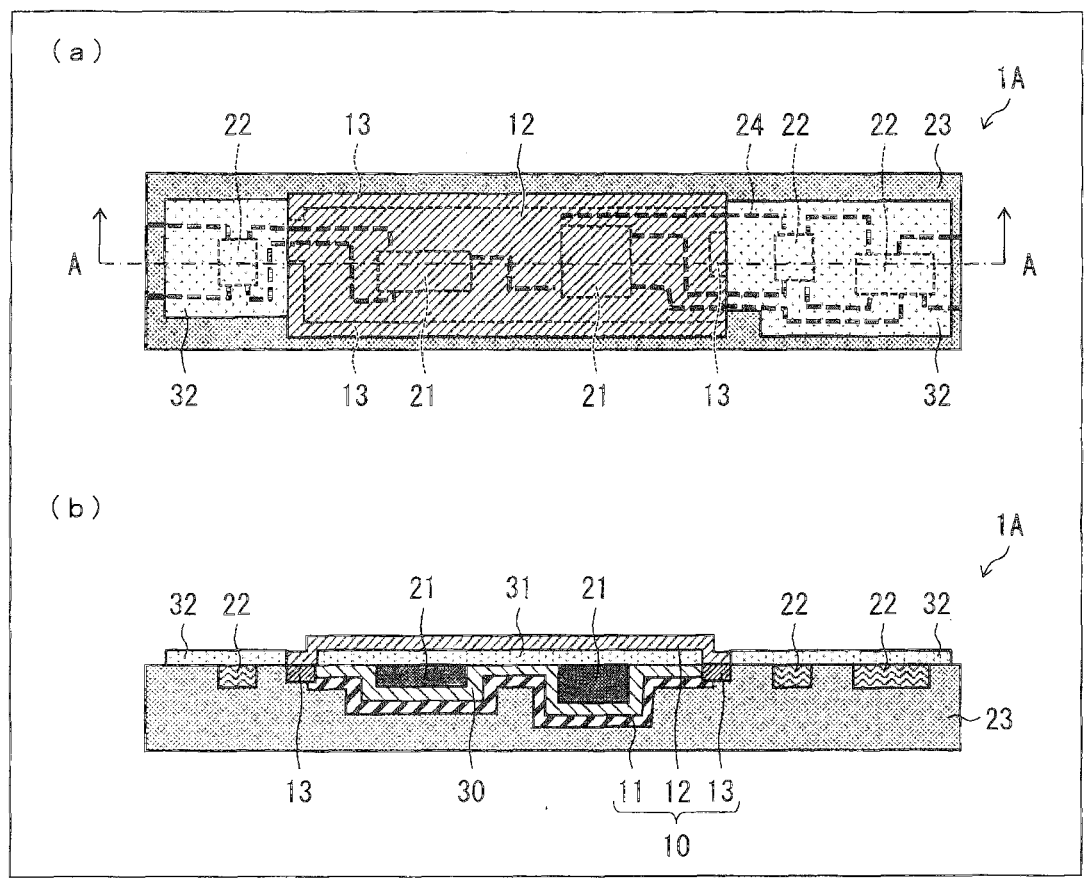

(51) Int. Cl.
*H05K 1/18* (2006.01)
*H05K 3/12* (2006.01)
*H05K 5/04* (2006.01)
*H05K 1/02* (2006.01)
*H01L 23/552* (2006.01)

(52) U.S. Cl.
CPC ........... *H05K 1/0218* (2013.01); *H05K 1/185* (2013.01); *H05K 1/189* (2013.01); *H05K 3/125* (2013.01); *H05K 5/04* (2013.01); *H05K 1/182* (2013.01); *H05K 2201/0715* (2013.01); *H05K 2201/0723* (2013.01); *H05K 2203/0156* (2013.01); *H05K 2203/0191* (2013.01); *H05K 2203/1316* (2013.01)

(58) Field of Classification Search
CPC ... H05K 2203/0191; H05K 2203/0156; H05K 2201/0723; H05K 2203/1316; H05K 2201/0715; H05K 1/18; H05K 9/0024; H05K 9/0081; H05K 9/0022; H01L 23/552; H01L 23/00
See application file for complete search history.

(56) References Cited

U.S. PATENT DOCUMENTS

| | | |
|---|---|---|
| 2010/0172116 A1 | 7/2010 | Yorita et al. |
| 2012/0008288 A1 | 1/2012 | Tsukamoto et al. |
| 2012/0030941 A1 | 2/2012 | Kawai |
| 2012/0292772 A1 | 11/2012 | Yorita et al. |
| 2015/0001690 A1 | 1/2015 | Nam |
| 2015/0189738 A1 | 7/2015 | Ho et al. |
| 2015/0325529 A1* | 11/2015 | Choi ........................ H01L 23/13 257/723 |
| 2017/0103950 A1 | 4/2017 | Kawai |
| 2017/0287847 A1* | 10/2017 | Dias ........................ H01L 23/552 |
| 2018/0240757 A1* | 8/2018 | Wong ...................... H01L 23/552 |

FOREIGN PATENT DOCUMENTS

| | | |
|---|---|---|
| CN | 104253094 A | 12/2014 |
| CN | 104754855 A | 7/2015 |
| JP | S61-55384 U | 4/1986 |
| JP | H5-79995 U | 10/1993 |
| JP | H6-501137 A | 2/1994 |
| JP | 2001-102789 A | 4/2001 |
| JP | 2001-274034 A | 10/2001 |
| JP | 2004-134669 A | 4/2004 |
| JP | 2006-100302 A | 4/2006 |
| JP | 2008-244289 A | 10/2008 |
| JP | 2010-258370 A | 11/2010 |
| JP | 2015-207703 A | 11/2015 |
| KR | 10-2013-0025594 A | 3/2013 |

OTHER PUBLICATIONS

An English translation of the Written Opinion (WO) of PCT/JP2017/012469 dated Jun. 20, 2017.

Office action dated Nov. 13, 2018 in a counterpart Korean patent application.

Chinese office action letter dated Mar. 20, 2019 in a counterpart Chinese patent application.

* cited by examiner

ELECTRONIC DEVICE AND METHOD FOR PRODUCING SAME

TECHNICAL FIELD

The present invention relates to an electronic device which includes an electromagnetic shield for blocking electromagnetic waves from an electronic component that operates in a high frequency band such as a microwave band or a millimeter-wave band used in a wireless device and the like. Further, the present invention relates to a method for producing such an electronic device.

BACKGROUND ART

In recent years, problems due to electromagnetic noises are increasing in accordance with (i) reduction in size of electronic apparatuses in which electronic components are mounted, (ii) increase in operating speed of such electronic apparatuses, and (iii) diversification of such electronic apparatuses (such as wireless LAN and on-vehicle radar). For example, in an on-vehicle microcomputer or the like, the number of codes in software is more than 200,000 rows and an operating frequency reaches 100 MHz and, from those, problems of malfunctions of electronic circuits which are caused by electromagnetic noises generated by electronic components have become notable.

Moreover, a high frequency functional component (e.g., an amplifier, a phase shifter, an attenuator, or the like) which is mounted on an electronic apparatus has a problem that a property of the high frequency functional component changes due to electromagnetic coupling with an electromagnetic wave that is radiated from another high frequency radiation source. Furthermore, there is a problem that electromagnetic resistance itself of a semiconductor chip is decreasing due to reduction in size, finer wiring, reduction in power consumption, and the like.

Under the circumstances, it has become more important to provide an electronic component with a shield for blocking electromagnetic waves in order to protect the electronic component from external electromagnetic noises and to inhibit leakage of electromagnetic noises from the electronic component to the outside.

As a general structure of an electromagnetic shield for blocking such electromagnetic waves, there are structures as proposed in, for example, Patent Literature 1 and Patent Literature 2. As illustrated in (a) of FIG. 6, in an electronic device 100 proposed in Patent Literature 1, an electronic component 140 which is fixed to a printed circuit board 120 with solder 130 is covered with a case 110 and an electrically conductive circuit 121, the case 110 being an electrically conductive metal case or a resin case having a surface on which an electrically conductive layer is provided, and the electrically conductive circuit 121 being provided on the printed circuit board 120. As illustrated in (b) of FIG. 6, in an electronic device 200 proposed in Patent Literature 2, an electronic component 230 is covered with a metal case 210 and a metal substrate 220.

CITATION LIST

Patent Literature

[Patent Literature 1]
Japanese Patent Application Publication Tokukai No. 2008-244289 (Publication date: Oct. 9, 2008)
[Patent Literature 2]
Japanese Patent Application Publication Tokukai No. 2010-258370 (Publication date: Nov. 11, 2010)
[Patent Literature 3]
Japanese Patent Application Publication Tokukai No. 2006-100302 (Publication date: Apr. 13, 2006)

SUMMARY OF INVENTION

Technical Problem

However, in such conventional techniques as described above, it is necessary to combine (i.e., assemble) the case 110, which is a separate component, with the printed circuit board 120 on which the electronic component 140 is mounted with the solder 130 or the like or it is necessary to combine (i.e., assemble) the metal case 210, which is a separate component, with the metal substrate 220. Those cause the following problems: that is, due to the assembly structure, a size of the electronic device increases and, due to assembly of components, a production cost increases.

In particular, the case 110, the metal case 210, and the metal substrate 220 need to have a size that is equal to or larger than a certain size suitable for the assembly, and this has been an obstacle to reduction in thickness of the electronic device that would be achieved by reducing a dimension in a height direction.

Figure 6:
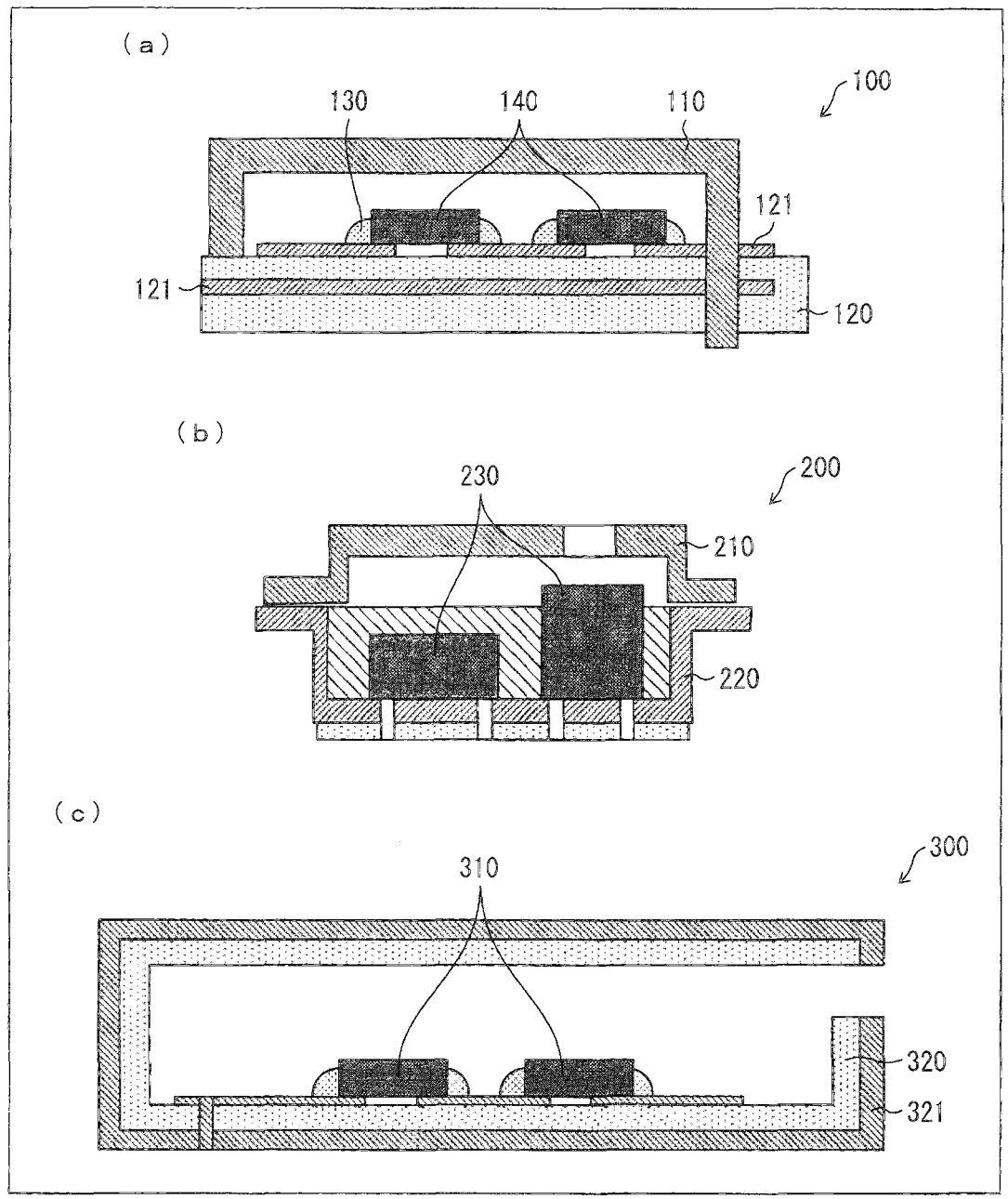

As a measure to solve such problems, an electronic device 300 disclosed in Patent Literature 3 has a configuration in which an electronic component 310 is covered with an electrically conductive circuit 321 by partially bending a flexible printed circuit board 320 on which the electronic component 310 is mounted (see (c) of FIG. 6). In the electronic device 300 having such a configuration, it is unnecessary to provide a metal case, etc. unlike the above described conventional techniques, and this makes it possible to bring about an effect of achieving reduction in size and reduction in thickness of the electronic device.

However, the process of appropriately bending the flexible printed circuit board 320 in a very small region is an industrially complicated technique, and this leads to a problem of increase in production cost. Moreover, it is necessary to secure a part on the flexible printed circuit board 320 for bending the flexible printed circuit board 320 to cover the electronic component 310, and the electronic component 310 cannot be placed in that part. From this, the electronic device 300 has a problem of restriction in designing a wiring circuit of the electronic component 310.

The present invention is accomplished in view of the conventional problems, and its object is to provide an electronic device which includes an electromagnetic shield, can keep down a production cost, can be made to have a reduced thickness, and has a high degree of freedom in designing a wiring circuit. Further, an object of the present invention is also to provide a method for producing such an electronic device.

Solution to Problem

In order to attain the object, the electronic device in accordance with an aspect of the present invention includes: at least one electronic component; an electrically conductive member which electromagnetically shields the at least one electronic component; and a resin molded body in which at least part of the at least one electronic component and at least part of the electrically conductive member which electromagnetically shields the at least one electronic component are embedded and fixed.

The method in accordance with an aspect of the present invention for producing an electronic device includes: an attaching/temporarily-fixing step of attaching and temporarily fixing at least one electronic component to a temporarily-fixing member; a first electromagnetically shielding step of covering the at least one electronic component with a first insulating member and a first electrically conductive member so as to electromagnetically shield the at least one electronic component; a resin molding step of placing the temporarily-fixing member inside a molding die after the first electromagnetically shielding step in a state in which the at least one electronic component, the first insulating member, and the first electrically conductive member are temporarily fixed to the temporarily-fixing member, and carrying out resin molding so that each of the at least one electronic component, the first insulating member, and the first electrically conductive member is at least partially embedded in a resin molded body; a taking-out step of separating the temporarily-fixing member from the resin molded body which has been made in the resin molding step; and a second electromagnetically shielding step of covering, after the taking-out step, the at least one electronic component with a second electrically conductive member so as to electromagnetically shield the at least one electronic component on a side opposite to a side on which the first electrically conductive member is provided.

Advantageous Effects of Invention

The present invention brings about an effect of providing an electronic device which includes an electromagnetic shield, can keep down a production cost, can be made to have a reduced thickness, and has a high degree of freedom in designing a wiring circuit. Further, the present invention brings about an effect of providing a method for producing such an electronic device.

BRIEF DESCRIPTION OF DRAWINGS (a) of FIG. 1 is a plan view schematically illustrating a configuration of an electronic device in accordance with Embodiment 1 of the present invention, and (b) of FIG. 1 is a cross-sectional view taken along the line A-A in (a) of FIG. 1.

Figure 2:
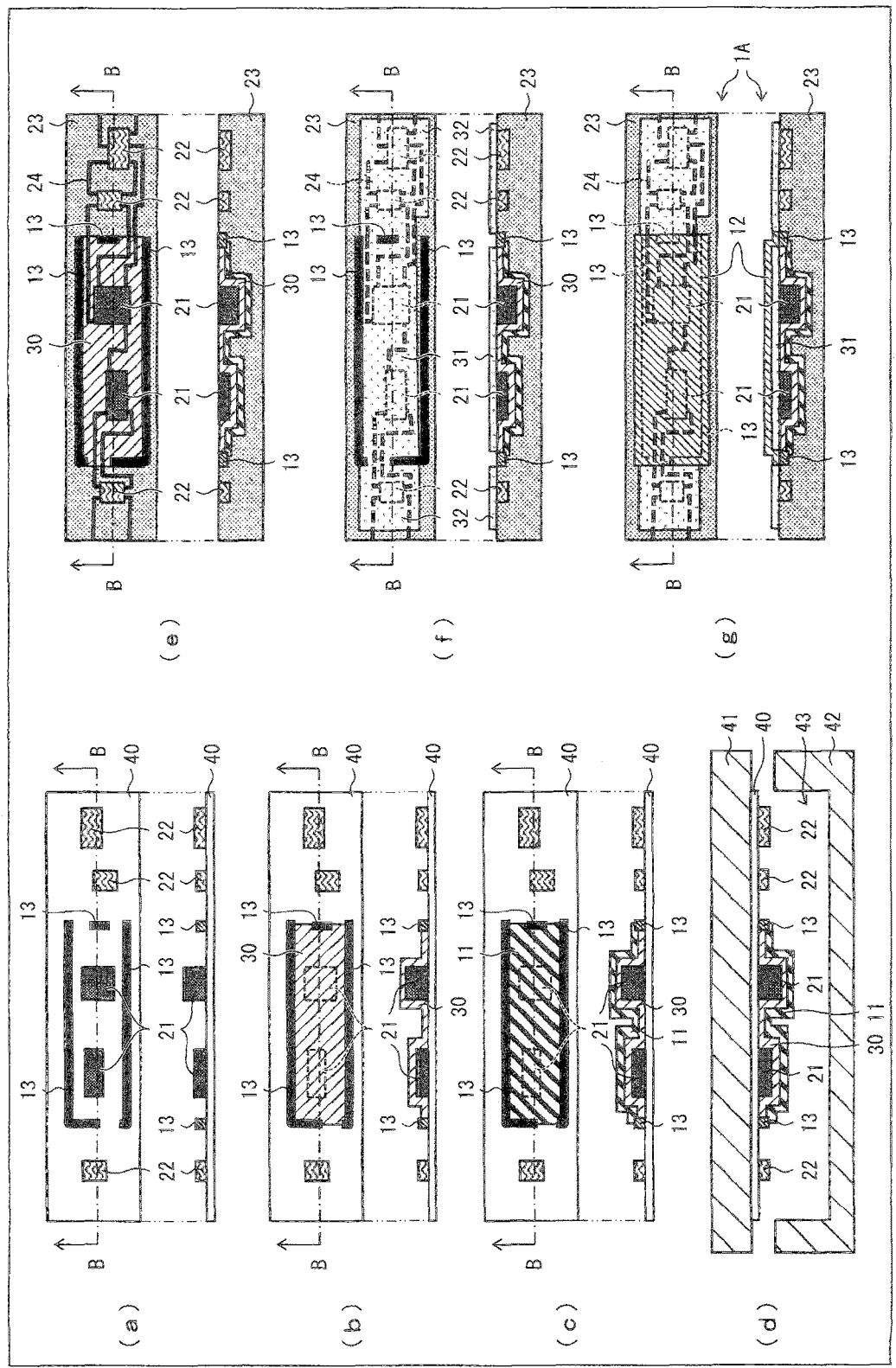

Each of (a), (b), (c), (e), (f), and (g) of FIG. 2 is a plan view and a cross-sectional view taken along the line B-B in the plan view for explaining an example of a method for producing the electronic device, and (d) of FIG. 2 is a lateral cross-sectional view for explaining an example of the method for producing the electronic device.

Figure 3:
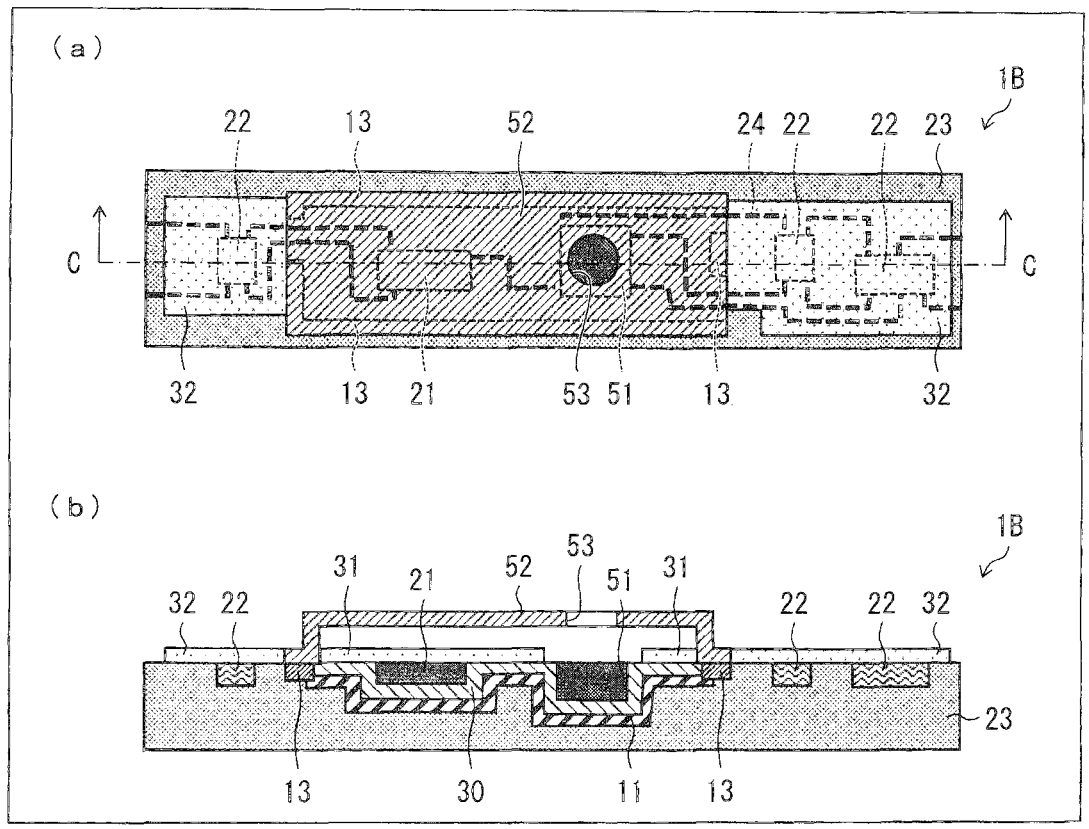

(a) of FIG. 3 is a plan view schematically illustrating a configuration of an electronic device in accordance with Embodiment 2 of the present invention, and (b) of FIG. 3 is a cross-sectional view taken along the line C-C in (a) of FIG. 3.

Figure 4:
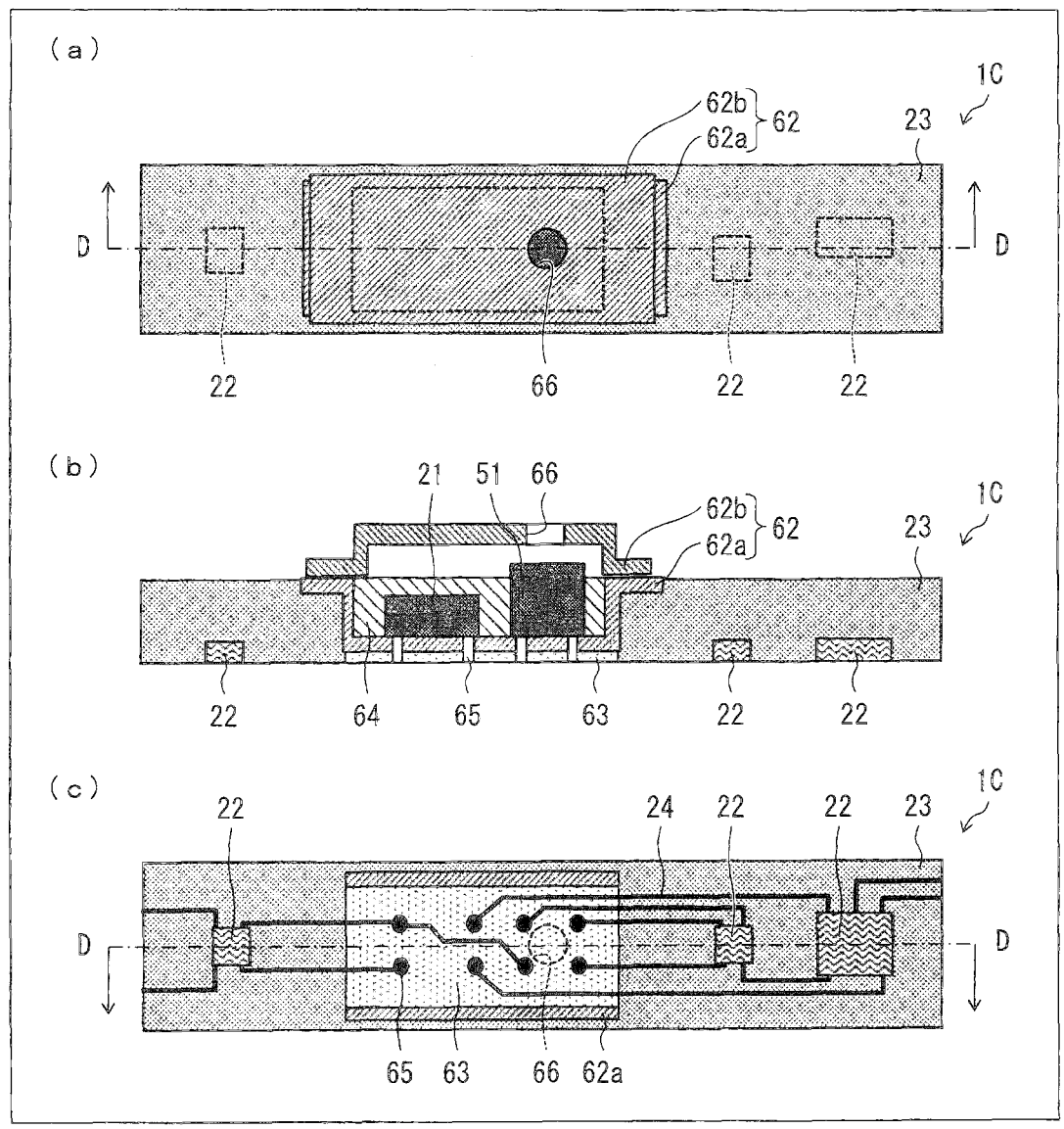

(a) of FIG. 4 is a plan view schematically illustrating a configuration of an electronic device in accordance with Embodiment 3 of the present invention, (b) of FIG. 4 is a cross-sectional view taken along the line D-D in (a) of FIG. 4, and (c) of FIG. 4 is a bottom view.

Figure 5:
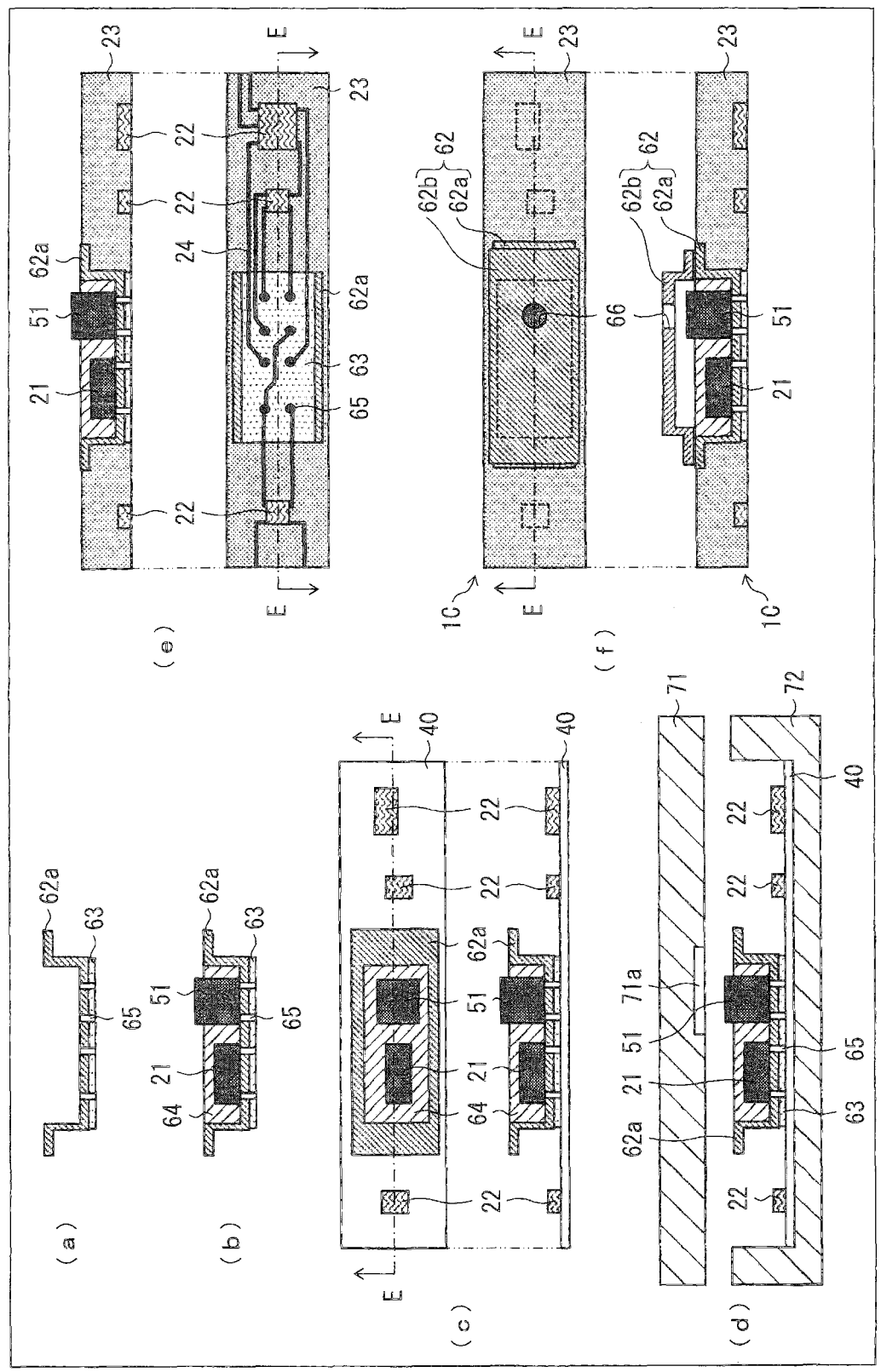

Each of (a), (b), and (d) of FIG. 5 is a lateral cross-sectional view for explaining an example of the method for producing the electronic device, each of (c) and (f) of FIG. 5 is a plan view and a cross-sectional view taken along the line E-E in the plan view for explaining an example of the method for producing the electronic device, and (e) of FIG. 5 is a bottom view and a cross-sectional view taken along the line E-E in the bottom view for explaining an example of the method for producing the electronic device.

FIG. 6 is a lateral cross-sectional view schematically illustrating a configuration of an electronic device which includes a conventional electromagnetic shield.

DESCRIPTION OF EMBODIMENTS

Embodiment 1

The following description will discuss an embodiment of the present invention with reference to FIG. 1 and FIG. 2.

In Embodiment 1, an example of an electronic device of the present invention will be described in which a high frequency functional component such as an amplifier, a phase shifter, or an attenuator is electromagnetically shielded by being covered with an electrically conductive thin layer. In this specification, the phrase "electromagnetically shielded" means that electromagnetic waves such as of a microwave band or a millimeter-wave band emitted by a high frequency radiation source are electromagnetically blocked, and a term "electromagnetic shield" means a constituent member which electromagnetically blocks electromagnetic waves.

In Embodiment 1, an example of the electronic device will be described in which a high frequency functional component such as an amplifier, a phase shifter, or an attenuator is electromagnetically shielded by an electrically conductive thin layer. Note, however, that the electronic device of the present invention is not limited to this. For example, the present invention is applicable to an electronic device in which various types of electronic components (such as a microphone, sensors such as a temperature/humidity sensor, an optical element, and a power source IC) are electromagnetically shielded and to a method for producing such an electronic device. Moreover, the constituent member for electromagnetically blocking electromagnetic waves can be a metal case, instead of the electrically conductive thin layer. Further, the constituent member for electromagnetically blocking electromagnetic waves can optionally be partially opened, e.g., can have an opening.

<Configuration of Electronic Device in Accordance with One Aspect of Present Invention>

The following description will discuss a configuration of an electronic device 1A in accordance with an aspect of the present invention, with reference to (a) and (b) of FIG. 1. (a) of FIG. 1 is a plan view schematically illustrating a configuration of the electronic device 1A in accordance with Embodiment 1. (b) of FIG. 1 is a cross-sectional view taken along the line A-A in the plan view illustrated in (a) of FIG. 1.

As illustrated in (a) and (b) of FIG. 1, the electronic device 1A in accordance with Embodiment 1 includes a high frequency functional component 21 (first electronic component), an electronic component 22 (second electronic component), and a resin molded body 23. The high frequency functional component 21 is electromagnetically shielded by being covered with an electrically conductive member 10 serving as an electromagnetic shield, the electronic component 22 is not covered with the electrically conductive member 10, and the resin molded body 23 is formed such that the high frequency functional component 21 and the electronic component 22 are embedded and fixed in the resin molded body 23. The electrically conductive member 10 covers the high frequency functional component 21 via inner insulating layers 30 and 31 (insulating member), and the high frequency functional component 21 and the electronic component 22 are electrically connected with each other via a wiring circuit 24 which is provided on a surface of the resin molded body 23. The wiring circuit 24 and the electronic component 22, which are in a region on the resin molded body 23 which region is not covered with the electrically conductive member 10, are covered with an exposed insulating layer 32 which is provided on the resin molded body 23. Note that, among the region which is not covered with the electrically conductive member 10, a region in which the exposed insulating layer 32 is provided can be set as appropriate, and the wiring circuit 24 and the electronic component 22 do not need to be covered with the exposed insulating layer 32 at all.

(Electrically Conductive Member)

The electrically conductive member 10 includes an embedded electrically conductive layer 11 (first electrically conductive member), an exposed electrically conductive layer 12 (second electrically conductive member), and a short-circuiting electrically conductive member 13 (third electrically conductive member). The embedded electrically conductive layer 11 is embedded in the resin molded body 23 together with the high frequency functional component 21, the exposed electrically conductive layer 12 is not embedded in the resin molded body 23, and the short-circuiting electrically conductive member 13 is embedded in the resin molded body 23 and causes the embedded electrically conductive layer 11 and the exposed electrically conductive layer 12 to be electrically short-circuited.

Each of the embedded electrically conductive layer 11 and the exposed electrically conductive layer 12 is an Ag thin film having a thickness of approximately 1 μm to 10 μm. Each of the embedded electrically conductive layer 11 and the exposed electrically conductive layer 12 can have any appropriate film thickness and can be made of any appropriate material for an intended electromagnetic shielding property, provided that each of the embedded electrically conductive layer 11 and the exposed electrically conductive layer 12 has electrical conductivity. The exposed electrically conductive layer 12 preferably has a film thickness which is as thin as possible, in view of reduction in thickness of the electronic device 1A which is achieved by restricting a height of a part projecting from the resin molded body 23. In a case where the thickness of each of the embedded electrically conductive layer 11 and the exposed electrically conductive layer 12 is 1 μm to 10 μm, it is possible to minimize a material necessary for forming the embedded electrically conductive layer 11 and the exposed electrically conductive layer 12, and it is also possible to reduce a cost of constituent members, as compared with a case where a metal case or the like is used. It is therefore possible to reduce a production cost.

The short-circuiting electrically conductive member 13 is a thin plate which is made of copper (Cu) or stainless steel and has a thickness of 0.1 mm. With regard to the short-circuiting electrically conductive member 13 also, a film thickness and a material thereof are not particularly limited, provided that the short-circuiting electrically conductive member 13 has electrical conductivity. However, the short-circuiting electrically conductive member 13 preferably has a film thickness to a certain extent because it is possible to inhibit deformation (i.e., wrinkles) caused in production (described later).

As illustrated in (a) of FIG. 1, three short-circuiting electrically conductive members 13 are provided so as to surround the high frequency functional component 21 in the plan view of the resin molded body 23. A shape and the number of pieces of the short-circuiting electrically conductive member 13 are not particularly limited, provided that a part is secured between the high frequency functional component 21 and the electronic component 22 for forming the wiring circuit 24 on the resin molded body 23. In the plan view of the resin molded body 23, as gaps are reduced in surrounding the high frequency functional component 21 with the short-circuiting electrically conductive member 13, an electromagnetic shielding property of the electrically conductive member 10 becomes better. This is because an area which is not covered with the electrically conductive member 10 in a space around the high frequency functional component 21 becomes smaller.

Note that the short-circuiting electrically conductive member 13 is not an essential constituent member in the electronic device 1A because the short-circuiting electrically conductive member 13 is a member for further improving the electromagnetic shielding property of the electrically conductive member 10 by causing short circuit between the embedded electrically conductive layer 11 and the exposed electrically conductive layer 12.

(High Frequency Functional Component)

The high frequency functional component 21 is an electronic component such as an amplifier, a phase shifter, or an attenuator and, in the electronic device 1A in accordance with Embodiment 1, two high frequency functional components 21 are provided. The number of pieces of the high frequency functional component 21 which is electromagnetically shielded by the electrically conductive member 10 is not limited to a particular one.

A connection electrode (not illustrated) is provided on a surface of the high frequency functional component 21, and the wiring circuit 24 is connected with the connection electrode. The high frequency functional component 21 is embedded in the resin molded body 23 such that the connection electrode is flush with or substantially flush with the surface of the resin molded body 23. Note, however, that the arrangement in which the high frequency functional component 21 is embedded in the resin molded body 23 is not limited to this, provided that the high frequency functional component 21 is at least partially embedded in the resin molded body 23.

(Electronic Component)

The electronic component 22 is an electronic component such as a capacitor, a resistor, or an IC and, in the electronic device 1A in accordance with Embodiment 1, three electronic components 22 are provided. The number of pieces of the electronic component 22 is not limited to a particular one.

A connection electrode (not illustrated) is provided on a surface of the electronic component 22, and the wiring circuit 24 is connected with the connection electrode. The electronic component 22 is embedded in the resin molded body 23 such that the connection electrode is flush with or substantially flush with the surface of the resin molded body 23. Note, however, that the arrangement in which the electronic component 22 is embedded in the resin molded body 23 is not limited to this, provided that the electronic component 22 is at least partially embedded in the resin molded body 23.

(Resin Molded Product)

The resin molded body 23 is a rectangular parallelepiped housing which is made of resin such as polycarbonate (PC) or acrylonitrile butadiene styrene (ABS). A material of which the resin molded body 23 is made can be another kind of resin. Moreover, a shape of the resin molded body 23 is not limited to a particular one.

(Inner Insulating Layer)

The inner insulating layers 30 and 31 are provided between the high frequency functional component 21 and the electrically conductive member 10 in a space surrounded by the electrically conductive member 10. The inner insulating layer 30 is embedded in the resin molded body 23, and the inner insulating layer 31 is not embedded in the resin molded body 23.

The inner insulating layer 30 is provided between the high frequency functional component 21 and the embedded electrically conductive layer 11, and is embedded in the resin molded body 23 together with the high frequency functional component 21 and the embedded electrically conductive layer 11. The inner insulating layer 30 is made of epoxy resin and has a thickness of approximately 5 μm to 10 μm. Note, however, that a film thickness and a material of the inner insulating layer 30 can be selected as appropriate, provided that the inner insulating layer 30 has an electrically insulating property. For example, the inner insulating layer 30 can be made of glass or ceramics.

Moreover, in the space surrounded by the electrically conductive member 10, a surface of the inner insulating layer 30 is flush with the surface of the resin molded body 23, and the wiring circuit 24 is provided on the surface of the inner insulating layer 30. Therefore, the inner insulating layer 30 is demanded to have strength and planarity to a certain extent and, in view of reduction in production cost, the inner insulating layer 30 is preferably made of resin having an electrically insulating property.

The other inner insulating layer, i.e., the inner insulating layer 31 is provided between the high frequency functional component 21 and the exposed electrically conductive layer 12 and is not embedded in the resin molded body 23. The inner insulating layer 31 is made of epoxy resin and has a thickness of approximately 5 μm to 10 μm. Note, however, that, as with the inner insulating layer 30, a film thickness and a material of the inner insulating layer 31 can also be selected as appropriate, provided that the inner insulating layer 31 has an electrically insulating property. For example, the inner insulating layer 31 can be made of glass or ceramics but is preferably made of electrically insulating resin.

(Wiring Circuit)

The wiring circuit 24 is an electrically conductive circuit which is electrically connected with the high frequency functional component 21 and the electronic component 22 on the surface of the inner insulating layer 30 and on the surface of the resin molded body 23 and is provided so as to be electrically connected with the outside of the electronic device 1A.

Here, in the electronic device 1A in accordance with Embodiment 1, the high frequency functional component 21 and the electronic component 22 are both embedded in the resin molded body 23 such that the connection electrodes are flush with or substantially flush with the surfaces of the inner insulating layer 30 and the resin molded body 23. Therefore, the wiring circuit 24 can be made up of wiring formed by spraying silver (Ag) ink with use of an ink-jet printer, and thus the wiring circuit 24 can be easily formed. Note that the wiring circuit 24 can be made of a material other than Ag and can be formed with another method. Further, a thickness and the like of wires are not particularly limited.

Note that the phrase "flush with or substantially flush with" means that a step height between the connection electrode of the high frequency functional component 21 or of the electronic component 22 and a plane formed by the surfaces of the inner insulating layer 30 and the resin molded body 23 is small (flat) enough to form the wiring circuit 24 by printing with use of a device such as an ink-jet printer.

The wiring circuit 24 is provided so as not to make contact with the short-circuiting electrically conductive member 13. Moreover, a part between the wiring circuit 24 and the exposed electrically conductive layer 12 is insulated with the inner insulating layer 31.

(Exposed Insulating Layer)

The exposed insulating layer 32 is provided so as to cover the electronic component 22 and the wiring circuit 24. The exposed insulating layer 32 is made of epoxy resin and has a thickness of approximately 5 μm to 10 μm. The exposed insulating layer 32 serves as a protective film (resist) for protecting the electronic component 22 and the wiring circuit 24. A film thickness and a material of the exposed insulating layer 32 can be selected as appropriate, provided that the exposed insulating layer 32 has an electrically insulating property.

<Method for Producing Electronic Device in Accordance with One Aspect of Present Invention>

The following description will discuss a method for producing the electronic device 1A in accordance with Embodiment 1 with reference to (a), (b), (c), (d), (e), (f), and (g) of FIG. 2. Each of (a), (b), (c), (e), (f), and (g) of FIG. 2 is a view for explaining an example method for producing the electronic device 1A in accordance with Embodiment 1 and includes a plan view of the electronic device 1A and a cross-sectional view taken along the line B-B in the plan view. (d) of FIG. 2 is a lateral cross-sectional view for explaining an example method for producing the electronic device 1A in accordance with Embodiment 1.

(Attaching/Temporarily-Fixing Step)

As illustrated in (a) of FIG. 2, in the method for producing the electronic device 1A in accordance with Embodiment 1, first, the high frequency functional component 21, the electronic component 22, and the short-circuiting electrically conductive member 13 (electrically conductive thin plate) are attached to a temporarily-fixing film 40 (temporarily-fixing member) with an adhesive agent (not illustrated) so as to be temporarily fixed (attaching/temporarily-fixing step). In this case, the high frequency functional component 21 and the electronic component 22 are fixed such that the respective connection electrodes (not illustrated) of the high frequency functional component 21 and the electronic component 22 contact with the temporarily-fixing film 40.

A material of which the temporarily-fixing film 40 is made can be, for example, polyethylene terephthalate (PET), polyethylene naphthalate (PEN), polyphenylene sulfide (PPS), or the like. The temporarily-fixing film 40 is preferably made of a material which allows ultraviolet rays to pass through and has flexibility for a reason described later.

Alternatively, the temporarily-fixing film 40 can be a carrier tape, a glass epoxy substrate, or the like. A material of which the temporarily-fixing film 40 is made is not particularly limited, provided that the temporarily-fixing film 40 can temporarily fix the electronic components and can be removed after the electronic device 1A is produced.

The temporary fixation can be carried out with use of, for example, an ultraviolet curable adhesive agent (not illustrated) that is applied to one surface of the temporarily-fixing film 40. Specifically, for example, GL-3005H (manufactured by Gluelabo Ltd.) which is the adhesive agent is applied with a thickness of 2 μm to 3 μm to the temporarily-fixing film 40 which is made of PET and has a thickness of 50 μm. This application can be carried out with an ink-jet printing method. After that, positioning of the high frequency functional component 21, the electronic component 22, and the short-circuiting electrically conductive member 13 is carried out, and then the high frequency functional component 21, the electronic component 22, and the short-circuiting electrically conductive member 13 are placed. Then, the adhesive agent is cured by being irradiated with an ultraviolet ray having an intensity of, for example, 3000 mJ/cm², and thus the high frequency functional component 21, the electronic component 22, and the short-circuiting electrically conductive member 13 are temporarily fixed to the temporarily-fixing film 40.

The short-circuiting electrically conductive member 13 is preferably a metallic member having a thickness of 0.1 mm or more. In a case where the short-circuiting electrically conductive member 13 is excessively thin, a wrinkle may be caused on the short-circuiting electrically conductive member 13 when the short-circuiting electrically conductive member 13 is industrially transferred so as to be attached to the temporarily-fixing film 40. In this case, the electronic device 1A is defective as a product. In view of this, in a case where the short-circuiting electrically conductive member 13 is a metallic member having a thickness of 0.1 mm or more, the short-circuiting electrically conductive member 13 can have rigidity to a certain extent, and therefore the above defect is less likely to be caused.

(First Electromagnetically Shielding Step)

As illustrated in (b) and (c) of FIG. 2, after the attaching/temporarily-fixing step, the inner insulating layer 30 (first insulating member) having a thickness of approximately 5 μm to 10 μm is formed on a surface of the high frequency functional component 21 which is temporarily fixed to the temporarily-fixing film 40, and further the embedded electrically conductive layer 11 (first electrically conductive member) which is made of Ag and has a thickness of approximately 1 μm to 10 μm is stacked on the high frequency functional component 21 via the inner insulating layer 30 (first electromagnetically shielding step).

Specifically, a region in which the inner insulating layer 30 is formed is surrounded by the short-circuiting electrically conductive member 13 on the temporarily-fixing film 40, and the region does not include the short-circuiting electrically conductive member 13. The inner insulating layer 30 can be formed so as to partially cover a surface of the short-circuiting electrically conductive member 13, provided that the inner insulating layer 30 is formed such that a surface of the embedded electrically conductive layer 11 makes contact with the surface of the short-circuiting electrically conductive member 13.

The inner insulating layer 30 and the embedded electrically conductive layer 11 can be formed with, for example, an ink-jet printing method. Note, however, that the method is not limited to a particular one. In a case where the ink-jet printing method is used, it is possible to easily selectively stack the inner insulating layer 30 and the embedded electrically conductive layer 11 in an intended region including the surface of the high frequency functional component 21. This allows reduction in material cost and in production cost. On the other hand, a screen printing method and the like may be inappropriate because there is a step made by the high frequency functional component 21.

As such, the high frequency functional component 21 is partially surrounded and partially electromagnetically shielded by the embedded electrically conductive layer 11 and the short-circuiting electrically conductive member 13.

(Resin Molding Step)

As illustrated in (d) of FIG. 2, after the first electromagnetically shielding step, the temporarily-fixing film 40, to which the high frequency functional component 21 covered with the inner insulating layer 30 and the embedded electrically conductive layer 11, the electronic component 22, and the short-circuiting electrically conductive member 13 are temporarily fixed, is placed in an upper die 41 such that a surface of the temporarily-fixing film 40, which surface is opposite to the surface to which the high frequency functional component 21, the electronic component 22, and the short-circuiting electrically conductive member 13 are temporarily fixed, is fixed to the upper die 41. Then, injection molding of resin is carried out by injecting a resin material into a die cavity 43 between the upper die 41 and a lower die 42 such that the temporarily fixed electronic components are embedded in the resin molded body 23 (resin molding step).

Conditions for carrying out injection molding can be selected as appropriate depending on resin that constitutes the resin molded body 23. For example, in a case where polycarbonate (PC) is used, injection molding is carried out at an injected resin temperature of 270° C. and at an injection pressure of 100 MPa. Alternatively, in a case where acrylonitrile butadiene styrene (ABS) is used, injection molding is carried out at an injected resin temperature of 180° C. and at an injection pressure of 20 kgf/cm².

It is possible to employ any of various resin materials as the resin for constituting the resin molded body 23. Moreover, conditions for carrying out injection molding are not particularly limited.

(Taking-Out Step)

Next, after the resin molding step, the resin molded body 23 in which the high frequency functional component 21, the electronic component 22, and the short-circuiting electrically conductive member 13 are embedded is taken out from the die cavity 43, and the temporarily-fixing film 40 is separated from the resin molded body 23 (taking-out step; not illustrated). Here, the inner insulating layer 30 and the embedded electrically conductive layer 11 are embedded in the resin molded body 23 together with the high frequency functional component 21.

In a case where the temporarily-fixing film 40 is a PET film, the temporarily-fixing film 40 is in a state of being greatly deformed due to thermal change in the resin molding step and therefore being detached from the resin molded body 23. As such, the temporarily-fixing film 40 can be easily separated from the resin molded body 23.

(Circuit Forming Step)

As illustrated in (e) of FIG. 2, after the taking-out step, the connection electrode of the high frequency functional component 21 and the connection electrode of the electronic component 22 which are exposed on a surface formed by the resin molded body 23 and the inner insulating layer 30 are connected to each other via the wiring circuit 24 (circuit forming step). The wiring circuit 24 can be formed with a method such as an ink-jet printing method in which an electrically conductive material (e.g., silver ink) is sprayed, a method using an aerosol, or a method using a dispenser.

The wiring circuit 24 can be easily formed by an appropriately selected method with a high degree of freedom of circuit design, and the electronic components can be simply electrically connected to each other without soldering and the like. Furthermore, as seen from an industrial view, the electronic components can be wired after positioning of the respective electronic components is carried out, and this makes it possible to accurately and easily electrically connect the electronic components to each other, as compared with a case where, for example, electronic components are aligned in accordance with a printed circuit board.

Here, the wiring circuit 24 is formed on the surface formed by the resin molded body 23 and the inner insulating layer 30 so as not to contact with the short-circuiting electrically conductive member 13, i.e., so as to avoid the short-circuiting electrically conductive member 13. This is because a defect may occur if the wiring circuit makes contact with the short-circuiting electrically conductive member 13 which is also exposed on the surface formed by the resin molded body 23 and the inner insulating layer 30.

(Second Electromagnetically Shielding Step)

As illustrated in (f) and (g) of FIG. 2, after the circuit forming step, an electrically insulating protective film (inner insulating layer 31, exposed insulating layer 32) having a thickness of 5 μm to 10 μm is formed so as to cover the high frequency functional component 21, the electronic component 22, and the wiring circuit 24 on the surface formed by the resin molded body 23 and the inner insulating layer 30. In this case, the electrically insulating protective film is not formed on the short-circuiting electrically conductive member 13. Subsequently, the exposed electrically conductive layer 12 (second electrically conductive member) which has a thickness of approximately 1 μm to 10 μm and is made of Ag is stacked so as to cover the high frequency functional component 21 via the inner insulating layer 31 (second insulating member) (second electromagnetically shielding step). As such, the electronic device 1A in accordance with Embodiment 1 can be obtained.

The electrically insulating protective film is, industrially, formed as a single component by an ink-jet printing method or the like but can be separated into the inner insulating layer 31 and the exposed insulating layer 32. The region in which the inner insulating layer 31 is formed is surrounded by the short-circuiting electrically conductive member 13 in the plan view of the resin molded body 23, and the region does not include the short-circuiting electrically conductive member 13. The inner insulating layer 31 can be formed so as to partially cover the surface of the short-circuiting electrically conductive member 13, provided that the inner insulating layer 31 is formed such that a surface of the exposed electrically conductive layer 12 makes contact with the surface of the short-circuiting electrically conductive member 13. The exposed insulating layer 32 is formed so as to protect the electronic component 22 and the wiring circuit 24 in a region that is not surrounded by the short-circuiting electrically conductive member 13.

The inner insulating layer 31 and the exposed insulating layer 32 can be formed with, for example, an ink-jet printing method. Note, however, that the method is not limited to a particular one. In a case where the ink-jet printing method is employed, it is possible to easily selectively form the inner insulating layer 31 and the exposed insulating layer 32 while avoiding the short-circuiting electrically conductive member 13.

The exposed electrically conductive layer 12 can be formed with, for example, an ink-jet printing method. Note, however, that the method is not limited to a particular one.

<Advantageous Points of Electronic Device in Accordance with One Aspect of Present Invention>

According to the electronic device 1A in accordance with Embodiment 1 which is configured as above described, the electronic device 1A includes the at least one high frequency functional component 21, the electrically conductive member 10 which electromagnetically shields the high frequency functional component 21, and at least part of the high frequency functional component 21 and at least part of the electrically conductive member 10 are embedded and fixed in the resin molded body 23.

In an electronic device including a conventional electromagnetic shield, an electronic component is mounted on a printed circuit board and the electronic component is covered with a metal case or the like, and the electronic component and the metal case project on the printed circuit board. Further, a component like the metal case need to have a size to a certain extent for industrial transfer and alignment, and this restricts a reduction in size and a reduction in thickness of the electronic device.

On the other hand, in the electronic device 1A in accordance with Embodiment 1, it is not necessary to use a metal case or the like, and the high frequency functional component 21 is at least partially embedded in the resin molded body 23. This makes it possible to lower a part projecting from the resin molded body 23, and the electronic device 1A can have a reduced dimension in the height direction and can thus achieve reduction in size and reduction in thickness.

Further, the electronic device 1A can be produced by the above described production process which does not include industrially complicated processes. It is therefore possible to keep down a production cost.

Further, as in the circuit forming step, the wiring circuit 24 can be freely designed with few restrictions, except that the wires of the wiring circuit 24 need to be provided so as not to contact with the short-circuiting electrically conductive member 13. This makes it possible to heighten the degree of freedom in wiring circuit design.

Moreover, according to the electronic device 1A in accordance with Embodiment 1, the electronic component 22 which is not electromagnetically shielded is also at least partially embedded in the resin molded body 23. Therefore, even in a case where various types of electronic components 22 are included, the electronic device 1A can have a reduced dimension in the height direction, and can thus achieve the reduction in thickness.

According to the electronic device 1A in accordance with Embodiment 1, the electrically conductive member 10 includes the embedded electrically conductive layer 11, the exposed electrically conductive layer 12, and the short-circuiting electrically conductive member 13, and the embedded electrically conductive layer 11 and the exposed electrically conductive layer 12 are electrically connected with each other via the short-circuiting electrically conductive member 13.

According to the configuration, the high frequency functional component 21 is surrounded by the electrically conductive member 10 with few gaps, and is thus highly electromagnetically shielded.

According to the above described method for producing the electronic device 1A in accordance with Embodiment 1, positioning of the high frequency functional component 21 and the electronic component 22 is carried out and then the high frequency functional component 21 and the electronic component 22 are attached to the temporarily-fixing film 40, and the inner insulating layer 30 and the embedded electrically conductive layer 11 are stacked on the high frequency functional component 21. After that, the high frequency functional component 21 and the electronic component 22 are embedded in the resin molded body 23, the wiring circuit 24 is formed, and the exposed electrically conductive layer 12 is stacked on the inner insulating layer 31 and the exposed insulating layer 32. By sequentially carrying out those stacking processes, the electronic device 1A can be produced.

This makes it possible to simplify the production process, that is, it is possible to employ the production process which does not include processes such as soldering, bending of the substrate, transferring of components or processed components, and assembling of components. As such, the electronic device 1A in accordance with Embodiment 1 can be produced while keeping down a production cost.

Further, the electronic device 1A in accordance with Embodiment 1 does not need to have a part that would be required for a process such as soldering, placing an electrically conductive case, or bending a printed circuit board, and this makes it possible to improve a degree of freedom in circuit design.

Embodiment 2

The following description will discuss another embodiment of the present invention with reference to FIG. 3. Note that configurations which are not described in Embodiment 2 are identical with those described in Embodiment 1. Moreover, for convenience of explanation, the same reference numerals are given to constituent members having functions identical with those illustrated in the drawings in Embodiment 1, and such constituent members will not be repeatedly described.

In Embodiment 1, as an example of the electronic device of the present invention, the electronic device 1A has been described in which the high frequency functional component 21 (such as an amplifier, a phase shifter, or an attenuator) is covered and electromagnetically shielded by the exposed electrically conductive layer 12 having the thickness of approximately 1 µm to 10 µm. Meanwhile, in Embodiment 2, as another example of the electronic device of the present invention, an electronic device 1B will be described in which a high frequency functional component 51 such as a microphone, a kind of sensor such as a temperature/humidity sensor, or an optical element is covered and electromagnetically shielded by a metal case 52 while providing a space inside the metal case 52.

That is, in a case where a high frequency functional component to be electromagnetically shielded includes the high frequency functional component 51 such as a microphone, a kind of sensor such as a temperature/humidity sensor, or an optical element, it is necessary to provide a space between the high frequency functional component 51 and an electromagnetic shield for covering the high frequency functional component 51, and the electronic device 1B of Embodiment 2 can be employed in such a case.

The following description will discuss a configuration of the electronic device 1B in accordance with Embodiment 2 with reference to (a) and (b) of FIG. 3. (a) of FIG. 3 is a plan view schematically illustrating a configuration of the electronic device 1B in accordance with Embodiment 2. (b) of FIG. 3 is a cross-sectional view taken along the line C-C in the plan view illustrated in (a) of FIG. 3.

As illustrated in (a) and (b) of FIG. 3, in the electronic device 1B in accordance with Embodiment 2, the high frequency functional component 21 and the high frequency functional component 51 are embedded and fixed in the resin molded body 23 together with the embedded electrically conductive layer 11 and the inner insulating layer 30, and the high frequency functional component 21 and the high frequency functional component 51 are provided in the space inside the metal case 52 (i.e., covered with the metal case 52).

The embedded electrically conductive layer 11 and the metal case 52 are electrically short-circuited by the short-circuiting electrically conductive member 13 that is provided between the embedded electrically conductive layer 11 and the metal case 52. The high frequency functional component 51 is electromagnetically shielded by the embedded electrically conductive layer 11, the metal case 52, and the short-circuiting electrically conductive member 13.

Moreover, the high frequency functional component 21, the high frequency functional component 51, and the electronic component 22 are electrically connected with each other via the wiring circuit 24.

The high frequency functional component 51 is an electronic component such as a microphone, a kind of sensor such as a temperature/humidity sensor, or an optical element, and one (1) high frequency functional component 51 is provided in the electronic device 1B of Embodiment 2. The number of pieces of the high frequency functional component 51 is not limited to a particular one.

The metal case 52 is made of metal which is formed in a case shape so that a space is provided above the high frequency functional component 51. The metal case 52 and the short-circuiting electrically conductive member 13, which is embedded in the resin molded body 23, are fixed with an electrically conductive adhesive agent (not illustrated) or by welding or the like. By the fixation, the metal case 52 and the embedded electrically conductive layer 11 embedded in the resin molded body 23 are electrically short-circuited, and the electromagnetic shield which covers the high frequency functional component 51 is thus configured.

Note that the metal case 52 can be a resin case having a surface on which an electrically conductive layer is provided by metal coating or the like. Alternatively, it is possible to employ a configuration in which the metal case 52 is provided only above the high frequency functional component 51, and the other part (high frequency functional component 21) is covered with the exposed electrically conductive layer 12. In this case, the metal case 52 can be fixed and connected to the exposed electrically conductive layer 12 such that the metal case 52 and the exposed electrically conductive layer 12 are electrically short-circuited.

The metal case 52 has an opening 53 which is provided above the high frequency functional component 51. Further, the inner insulating layer 31 is not formed on the high frequency functional component 51. This is because the high frequency functional component 51 which is a microphone, a sensor, or the like needs to contact with outside air.

The electronic device 1B having such a configuration can be produced as follows: that is, in the second electromagnetically shielding step, the inner insulating layer 31 is formed so as to avoid a part above the high frequency functional component 51, and the metal case 52 covers the high frequency functional component 51 so as to make contact with the surface of the short-circuiting electrically conductive member 13, and the metal case 52 is fixed to the short-circuiting electrically conductive member 13 so as to be electrically connected to the short-circuiting electrically conductive member 13.

In the electronic device 1B in accordance with Embodiment 2, the high frequency functional component 51 is electromagnetically shielded by being covered with the metal case 52 having the opening 53. Note, however, that, in a case where a space above the high frequency functional component 51 does not need to be secured, it is possible that the exposed electrically conductive layer 12 is provided, instead of the metal case 52, while avoiding a part above the high frequency functional component 51. This makes it possible to electromagnetically shield the high frequency functional component 51 while providing an opening above the high frequency functional component 51.

As such, according to the electronic device 1B in accordance with Embodiment 2, it is possible to electromagnetically shield the high frequency functional component 51 for which at least one of a space or an opening needs to be provided above the high frequency functional component 51.

Embodiment 3

The following description will discuss another embodiment of the present invention with reference to FIGS. 4 and 5. Note that configurations which are not described in Embodiment 3 are identical with those described in Embodiment 1 and Embodiment 2. Moreover, for convenience of explanation, the same reference numerals are given to constituent members having functions identical with those illustrated in the drawings in Embodiment 1 and Embodiment 2, and such constituent members will not be repeatedly described.

In Embodiment 2, as an example of the electronic device of the present invention, the electronic device 1B has been described in which the high frequency functional component 51 embedded in the resin molded body 23 is covered and electromagnetically shielded by the metal case 52 while providing the space inside the metal case 52. Meanwhile, in Embodiment 3, as another example of the electronic device of the present invention, a configuration of an electronic device 1C will be described which includes a metal housing 62 that is made of metal and serves as an electrically conductive member for containing the high frequency functional component 51 therein. Further, in the electronic device 1C, the high frequency functional component 51 and the metal housing 62 are at least partially embedded in the resin molded body 23.

The following description will discuss a configuration of the electronic device 1C in accordance with Embodiment 3 with reference to (a), (b), and (c) of FIG. 4. (a) of FIG. 4 is a plan view schematically illustrating a configuration of the electronic device 1C in accordance with Embodiment 3. (b) of FIG. 4 is a cross-sectional view taken along the line D-D in the plan view illustrated in (a) of FIG. 4. (c) of FIG. 4 is a bottom view illustrating the electronic device 1C.

As with Embodiment 2, in a case where the high frequency functional component to be electromagnetically shielded includes the high frequency functional component 51 such as a microphone, a kind of sensor such as a temperature/humidity sensor, or an optical element, it is possible to employ a configuration in which the high frequency functional component 51 is contained and electromagnetically shielded in the metal housing 62 made of a metal material while providing a space above the high frequency functional component 51. In the descriptions below, it is possible to refer to Patent Literature 2 as appropriate in regard to a configuration of an electronic module in which an electronic component is contained in the metal housing 62 and to a method for producing the electronic module.

(Configuration of Electronic Device 1C)

As illustrated in (a), (b), and (c) of FIG. 4, in the electronic device 1C in accordance with Embodiment 3, the high frequency functional component 21 and the high frequency functional component 51 are contained inside the metal housing 62 (electrically conductive member) made up of a first box 62a and a second box 62b, and the first box 62a is embedded in the resin molded body 23 together with the high frequency functional component 21 and the high frequency functional component 51 which are contained inside the first box 62a. The electronic component 22 is also embedded in the resin molded body 23.

Each of the first box 62a and the second box 62b is obtained by sheet-metal working, and is a box-shaped constituent member having an opening. The first box 62a and the second box 62b are fixed to each other such that the respective openings thereof face each other, and thus the metal housing 62 is constituted. The fixation is carried out with an electrically conductive adhesive agent (not illustrated) or by welding or the like. From this, the first box 62a and the second box 62b are electrically short-circuited, and the metal housing 62 serves as an electromagnetic shield for covering the high frequency functional component 21 and the high frequency functional component 51.

An example of a material (metal plate) for use in the first box 62a encompasses a nickel-iron alloy (42Alloy) plate having a thickness of 0.15 mm. An example of a material (metal plate) for use in the second box 62b encompasses a nickel-iron alloy (42Alloy) plate having a thickness of 0.12 mm.

Note that each of the first box 62a and the second box 62b can be a resin box having a surface on which an electrically conductive layer is provided by metal coating or the like. Moreover, it is possible to employ a configuration in which the second box 62b is provided only above the high frequency functional component 51, and the other part (high frequency functional component 21) is covered with the exposed electrically conductive layer 12. In this case, the second box 62b can be fixed and connected to the exposed electrically conductive layer 12 such that the second box 62b and the exposed electrically conductive layer 12 are electrically short-circuited.

An insulating layer 63 is provided on an outer side (here, outer side on a bottom surface side) of the first box 62a. An example of the insulating layer 63 encompasses a layer made of an epoxy-based adhesive agent.

In the first box 62a, the high frequency functional component 21 and the high frequency functional component 51 are fixed by a potting section 64 (insulating member) which fills the first box 62a and is cured, and has electrically insulating property. An example of the potting agent constituting the potting section 64 encompasses an epoxy-based sealing agent. Here, the high frequency functional component (tall component) 51 has a height greater than a depth of the first box 62a, and an upper part of the high frequency functional component 51 is exposed from the potting section 64.

Moreover, a through hole 65 is provided in a bottom plate of the first box 62a. The through hole 65 is provided in order to draw out, to a surface of the insulating layer 63, conducting wires (not illustrated) such as gold wires which are connected with the high frequency functional component 21 and the high frequency functional component 51. That is, the conducting wires are passed through the through hole 65, and one end of each of the conducting wires is electrically connected with the high frequency functional component 21 or the high frequency functional component 51, and the other end of the conducting wire is drawn out to the surface of the insulating layer 63 and is electrically connected with the wiring circuit 24. With the arrangement, the high frequency functional component 21 and the high frequency functional component 51 are electrically connected to the electronic component 22. In (c) of FIG. 4, through holes 65 are provided at eight locations. Note, however, that the number of through holes 65 can of course be determined as appropriate in accordance with types of and the number of pieces of electronic components to be mounted.

The second box 62b is not embedded in the resin molded body 23, and an opening 66 is provided above the high frequency functional component 51. Further, the upper part of the high frequency functional component 51 is exposed from the potting section 64. As such, in the electronic device 1C, the space is provided above the high frequency functional component 51, and the high frequency functional component 51 contacts with outside air.

(Method for Producing Electronic Device 1C)

The following description will discuss a method for producing the electronic device 1C in accordance with Embodiment 3 with reference to (a), (b), (c), (d), (e), and (f) of FIG. 5. Each of (a), (b), and (d) of FIG. 5 is a lateral cross-sectional view for explaining an example method for producing the electronic device 1C in accordance with Embodiment 3. Each of (c) and (f) of FIG. 5 is a view for explaining an example method for producing the electronic device 1C in accordance with Embodiment 3 and includes a plan view of the electronic device 1C and a cross-sectional view taken along the line E-E in the plan view. (e) of FIG. 5 is a view for explaining an example method for producing the electronic device 1C in accordance with Embodiment 3 and includes a bottom view of the electronic device 1C and a cross-sectional view taken along the line E-E in the bottom view.

As illustrated in (a) of FIG. 5, the first box 62a provided with the insulating layer 63 and the through hole 65 is prepared.

Next, as illustrated in (b) of FIG. 5, the high frequency functional component 21 and the high frequency functional component 51 are placed inside the first box 62a (component containing step), and conducting wires (not illustrated) connected with the high frequency functional component 21 and the high frequency functional component 51 are drawn out through the through hole 65 (conducting wire drawing-out step), and then the first box 62a is filled with a liquid potting agent (epoxy-based sealing agent) (component fixing step). When the liquid potting agent is cured, the potting section 64 is formed. From this, the high frequency functional component 21 and the high frequency functional component 51 are fixed in the first box 62a (first electromagnetically shielding step).

In this case, the potting section 64 is provided so as not to cover a part in which the first box 62a is connected and fixed to the second box 62b later. Moreover, the height of the high frequency functional component 51 is greater than the depth of a recessed part of the first box 62a, and therefore the upper part of the high frequency functional component 51 projects from the potting section 64.

Next, as illustrated in (c) of FIG. 5, the first box 62a, in which the high frequency functional component 21 and the high frequency functional component 51 are fixed, and the electronic component 22 are attached and temporarily fixed to the temporarily-fixing film 40 with an adhesive agent (not illustrated) (attaching/temporarily-fixing step). In this case, the first box 62a is temporarily fixed to the temporarily-fixing film 40 such that a surface of the first box 62a in which surface the insulating layer 63 and the through hole 65 are provided contacts with the temporarily-fixing film 40. The electronic component 22 is fixed such that the connection electrode (not illustrated) of the electronic component 22 contacts with the temporarily-fixing film 40.

After that, as illustrated in (d) of FIG. 5, the temporarily-fixing film 40 is placed in a lower molding die 72. Then, as with Embodiment 1, a resin molding step is carried out between an upper molding die 71 and the lower molding die 72, and then a taking-out step is carried out. In this case, the upper molding die 71 has a recessed part 71a which is provided at a location corresponding to the upper part of the high frequency functional component 51 which upper part projects from the potting section 64.

Next, as illustrated in (e) of FIG. 5, the connection electrode of the electronic component 22 exposed on the surface of the resin molded body 23 is connected, via the wiring circuit 24, to the conducting wires drawn out through the through hole 65 of the first box 62a on the surface formed by the resin molded body 23 and the insulating layer 63 (circuit forming step).

Lastly, as illustrated in (f) of FIG. 5, the second box 62b is electrically connected and fixed to the first box 62a with an electrically conductive adhesive agent or by welding or the like, and thus the metal housing 62 is obtained. With the metal housing 62, the high frequency functional component 21 and the high frequency functional component 51 are covered to form an electromagnetic shield structure, and thus the electronic device 1C in accordance with Embodiment 3 can be obtained.

As such, by forming the wiring circuit 24 and combining the second box 62b with the first box 62a after the resin molding step, it is possible to prevent quality problems that the metal housing 62 is deformed or electrical connection of wires is broken in injection molding of resin.

As above described, the electronic device in accordance with an aspect of the present invention includes: at least one electronic component; an electrically conductive member which electromagnetically shields the at least one electronic component; and a resin molded body in which at least part of the at least one electronic component and at least part of the electrically conductive member which electromagnetically shields the at least one electronic component are embedded and fixed.

According to the configuration, the at least one electronic component is electromagnetically shielded by the electrically conductive member, and at least part of the electronic component and at least part of the electrically conductive member are embedded and fixed in the resin molded body. That is, it is possible to lower a height of a part projecting on the resin molded body. Therefore, it is possible to reduce a dimension of the electronic device in the height direction, and to thus achieve the reduction in thickness.

Moreover, such a structure can be produced by, for example, electromagnetically shielding the electronic component with an electrically conductive member that is provided on one side of the electronic component, then carrying out injection molding of resin, and then further providing another electrically conductive member on the other side of the electronic component. After the injection molding of resin and before providing the another electrically conductive member on the other side of the electronic component, a wiring circuit can be formed. From this, it is possible to simplify the production process, and to heighten the degree of freedom in wiring circuit design.

Therefore, the present invention can provide an electronic device which includes an electromagnetic shield, can keep down a production cost, can be made to have a reduced thickness, and has a high degree of freedom in designing a wiring circuit. Further, the present invention can provide a method for producing such an electronic device.

The electronic device in accordance with an aspect of the present invention preferably further includes: a first electronic component which is the at least one electronic component that is electromagnetically shielded; and a second electronic component which is not electromagnetically shielded, the second electronic component being at least partially embedded in the resin molded body.

According to the configuration, the second electronic component is provided which is not electromagnetically shielded, and the second electronic component is also at least partially embedded in the resin molded body. Therefore, in the electronic device including the second electronic component also, it is possible to reduce a dimension in the height direction, and to thus achieve the reduction in thickness.

Moreover, it is possible to electrically connect the first electronic component with the second electronic component via the wiring circuit, and it is thus possible to provide an electronic device in which various types of and various numbers of electronic components are mounted.

In the electronic device in accordance with an aspect of the present invention, it is preferable that the first electronic component is fixed with an insulating member that is provided in a space surrounded by the electrically conductive member; and at least part of the insulating member is embedded in the resin molded body together with at least part of the first electronic component and at least part of the electrically conductive member.

According to the configuration, the first electronic component and the electrically conductive member are insulated by the insulating member, and the insulating member is also at least partially embedded in the resin molded body. Therefore, even in a case where the insulating member is provided, it is possible to reduce a dimension of the electronic device in the height direction, and to thus achieve the reduction in thickness.

In the electronic device in accordance with an aspect of the present invention, it is preferable that the electrically conductive member includes a first electrically conductive member which is embedded in the resin molded body, a second electrically conductive member which is not embedded in the resin molded body, and at least one third electrically conductive member which is provided between the first electrically conductive member and the second electrically conductive member; and the first electrically conductive member and the second electrically conductive member are electrically connected with each other via the at least one third electrically conductive member.

According to the configuration, the first electronic component is surrounded by the first electrically conductive member, the second electrically conductive member, and the third electrically conductive member. This makes it possible to highly electromagnetically shield the first electronic component, as compared with a case where the third electrically conductive member is not provided.

In the electronic device in accordance with an aspect of the present invention, it is preferable that each of the first electrically conductive member and the second electrically conductive member is a thin film having a thickness of 1 μm to 10 μm.

According to the configuration, each of the first electrically conductive member and the second electrically conductive member can be formed by a method (e.g., ink-jet printing method) for forming a thin film. Moreover, it is possible to minimize materials to be used, and it is also possible to reduce a cost of constituent members, as compared with a case where a metal case or the like is used. It is therefore possible to reduce a production cost.

In the electronic device in accordance with an aspect of the present invention, it is preferable that the at least one third electrically conductive member is a metallic member having a thickness of 0.1 mm or more.

According to the configuration, it is possible to cause the third electrically conductive member to have rigidity to a certain extent. This makes it possible to prevent the third electrically conductive member from being deformed (e.g., wrinkled) during industrial transfer, that is, it is possible to prevent a defect as a product.

In the electronic device in accordance with an aspect of the present invention, it is preferable that an electrode of the first electronic component is connected with an electrode of the second electronic component on a surface of the resin molded body and on a surface of the insulating member, which is embedded in the resin molded body, via wiring connection such that a wire of the wiring connection connecting the electrode of the first electronic component with the electrode of the second electronic component does not contact with the at least one third electrically conductive member; and a part between the wire of the wiring connection and the second electrically conductive member is insulated with an insulating member which is not embedded in the resin molded body or with air.

According to the configuration, it is possible to provide the electronic device in which the electrode of the first electronic component is wired to the electrode of the second electronic component.

In the electronic device in accordance with an aspect of the present invention, it is preferable that the electrode of the first electronic component and the electrode of the second electronic component are flush with or substantially flush with the surface of the resin molded body.

According to the configuration, it is possible to easily establish wiring connection between the electrode of the first electronic component and the electrode of the second electronic component with use of a device such as an ink-jet printer.

In the electronic device in accordance with an aspect of the present invention, it is possible that the second electrically conductive member has an opening which is provided immediately above at least one of the first electronic component.

According to the configuration, it is possible to provide the electronic device in which, as the first electronic component, an electronic component is used which is of a type that needs to contact with outside air.

In the electronic device in accordance with an aspect of the present invention, it is possible that the electrically conductive member is a housing made of a metal material; the housing is made up of a first box and a second box which are fixed such that respective openings of the first box and the second box face each other, the first box being embedded in the resin molded body, the second box projecting from the surface of the resin molded body, an insulating layer being provided on an outer side of the first box, and the first box having a through hole through which a conducting wire connected with the first electronic component is drawn out to a surface of the insulating layer; and the surface of the insulating layer and an outlet of the through hole are flush with a back surface of the resin molded body.

According to the configuration, the first box containing the first electronic component is embedded in the resin molded body, and the second box projects from the surface of the resin molded body. Therefore, even in the configuration in which such a housing is used, it is possible to reduce a dimension of the electronic device in the height direction, and to thus achieve the reduction in thickness.

Moreover, it is possible to produce the electronic device by preparing an assembly in which the first electronic component is contained in the first box in a separate step, and then carrying out resin molding with use of the assembly at an appropriate time. Therefore, the assembly in which the first electronic component is contained in the first box can be produced for another purpose, and this makes it possible to improve a degree of freedom in production process, and to reduce a production cost.

In the electronic device in accordance with an aspect of the present invention, it is possible that the second electronic component is embedded in the resin molded body such that an electrode is exposed on the back surface of the resin molded body; and the conducting wire which is connected with the first electronic component is connected with the electrode of the second electronic component on the back surface of the resin molded body via wiring connection.

According to the configuration, it is possible to provide the electronic device in which the housing made of a metal material serves as an electrically conductive member, and the electrode of the first electronic component is wired to the electrode of the second electronic component.

In the electronic device in accordance with an aspect of the present invention, it is preferable that the wiring connection is formed by printing with use of an electrically conductive material.

According to the configuration, it is possible to easily provide wiring with minimum necessary materials. Moreover, in a case where a protective film for covering the wiring is provided, it is possible to keep a thickness of the protective film thin. It is therefore possible to keep down a cost of constituent members and to reduce a production cost.

The method in accordance with an aspect of the present invention for producing an electronic device includes: an attaching/temporarily-fixing step of attaching and temporarily fixing at least one electronic component to a temporarily-fixing member; a first electromagnetically shielding step of covering the at least one electronic component with a first insulating member and a first electrically conductive member so as to electromagnetically shield the at least one electronic component; a resin molding step of placing the temporarily-fixing member inside a molding die after the first electromagnetically shielding step in a state in which the at least one electronic component, the first insulating member, and the first electrically conductive member are temporarily fixed to the temporarily-fixing member, and carrying out resin molding so that each of the at least one electronic component, the first insulating member, and the first electrically conductive member is at least partially embedded in a resin molded body; a taking-out step of separating the temporarily-fixing member from the resin molded body which has been made in the resin molding step; and a second electromagnetically shielding step of covering, after the taking-out step, the at least one electronic component with a second electrically conductive member so as to electromagnetically shield the at least one electronic component on a side opposite to a side on which the first electrically conductive member is provided.

According to the configuration, positioning of the electronic component is carried out and then the electronic component is attached to the temporarily-fixing member, then one side of the electronic component is covered and electromagnetically shielded by the first insulating member and the first electrically conductive member, and then resin molding is carried out, and thus the resin molded body can be obtained in which the electronic component, the first insulating member, and the first electrically conductive member are embedded. After that, the electronic component is covered with the second electrically conductive member, and thus the electronic component can be electromagnetically shielded. Those processes can be easily carried out with industrially simple processes.

This makes it possible to obtain the configuration in which the electronic component, the first insulating member, and the first electrically conductive member are embedded in the resin molded body, and the second electrically conductive member projects on the resin molded body. Moreover, it is possible to form the wiring circuit after the taking-out step and before the second electromagnetically shielding step.

Therefore, it is possible to provide the method which can produce the electronic device whose dimension in the height direction is lowered and thickness is reduced, and can keep down the production cost and heighten the degree of freedom in wiring circuit design.

In the method in accordance with an aspect of the present invention for producing an electronic device, it is preferable that, in the attaching/temporarily-fixing step, an electrically conductive thin plate which has electrical conductivity is attached to the temporarily-fixing member; the method further includes, after the taking-out step and before the second electromagnetically shielding step, a circuit forming step of forming a wiring circuit, which is connected with an electrode of the at least one electronic component, on a surface formed by the resin molded body and the first insulating member such that a wire does not make contact with the electrically conductive thin plate; and in the second electromagnetically shielding step, a second insulating member is stacked on the wiring circuit and the at least one electronic component in a part excluding the electrically conductive thin plate, and then a second electrically conductive member is stacked on a region in which the at least one electronic component is embedded and which includes the electrically conductive thin plate.

According to the configuration, it is possible to appropriately form the wiring circuit in the configuration in which the electrically conductive thin plate is embedded in the resin molded body. Moreover, the second insulating member and the second electrically conductive member are stacked on the electronic component, and the electronic component is surrounded by the first electrically conductive member, the second electrically conductive member, and the electrically conductive thin plate. As such, the electronic component is highly electromagnetically shielded.

In the method in accordance with an aspect of the present invention for producing an electronic device, it is preferable that the first insulating member, the first electrically conductive member, the second insulating member, the second electrically conductive member, and the wiring circuit are formed by ink-jet printing.

According to the configuration, it is possible to form the first insulating member, the first electrically conductive member, the second insulating member, the second electrically conductive member, and the wiring circuit with use of the same ink-jet device while suitably switching heads in the ink-jet device, and this makes it possible to reduce a production cost.

In the method in accordance with an aspect of the present invention for producing an electronic device, it is possible that the first electromagnetically shielding step includes a component containing step of placing the at least one electronic component inside a first box which has electrical conductivity and serves as the first electrically conductive member and which has an outer side on which an insulating layer is provided, a conducting wire drawing-out step of drawing out a conducting wire, which is connected with the at least one electronic component, to a surface of the insulating layer through a through hole provided in the first box, and a component fixing step of fixing the at least one electronic component by filling the first box with the first insulating member after the conducting wire drawing-out step; and in the attaching/temporarily-fixing step, a side of the first box on which side the insulating layer and the through hole are provided is attached to the temporarily-fixing member.

According to the configuration, it is possible to produce the electronic device with use of the assembly in which the electronic component is contained in the first box. The assembly in which the electronic component is contained in the first box can be produced for another purpose, and this makes it possible to improve a degree of freedom in production process, and to reduce a production cost.

In the method in accordance with an aspect of the present invention for producing an electronic device, it is possible that, in the second electromagnetically shielding step, a second box, which has electrical conductivity and has an opening provided in a part of the second box, is fixed such that the opening locates immediately above the at least one electronic component and respective openings of the first box and the second box face each other, and thus a housing encompassing the at least one electronic component is formed.

According to the configuration, it is possible to provide the method for producing the electronic device in which, as the electronic component, an electronic component is used which is of a type that needs to contact with outside air.

In the method in accordance with an aspect of the present invention for producing an electronic device, it is possible that, in the component containing step, at least one tall component which serves as the at least one electronic component is placed in the first box, the at least one tall component having a height that is greater than a depth of the first box; and in the resin molding step, resin molding is carried out such that each of the at least one tall component, the first insulating member, and the first electrically conductive member is at least partially embedded in a resin molded body between an upper molding die and a lower molding die, the upper molding die having a hollow at a location at which the at least one tall component abuts the upper molding die.

According to the configuration, even in a case where the tall component is used, it is possible to produce the electronic device with use of the assembly in which the tall component is contained in the first box.

The method in accordance with an aspect of the present invention for producing an electronic device can further include: a circuit forming step of, after the taking-out step and before the second electromagnetically shielding step, forming a wiring circuit on a surface formed by the resin molded body and the insulating layer, the wiring circuit being connected with the conducting wire that is connected with the at least one electronic component.

According to the configuration, it is possible to produce the electronic device, in which the electronic component is wired, with use of the assembly in which the electronic component is contained in the first box.

In the method in accordance with an aspect of the present invention for producing an electronic device, it is preferable that, in the circuit forming step, the wiring circuit is formed by printing wiring by spraying electrically conductive ink.

According to the configuration, it is possible to easily provide the wiring connection with use of a device such as an ink-jet printer.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST 1A through 1C: Electronic device
10: Electrically conductive member
11: Embedded electrically conductive layer (first electrically conductive member)
12: Exposed electrically conductive layer (second electrically conductive member)
13: Short-circuiting electrically conductive member (third electrically conductive member, electrically conductive thin plate)
21: High frequency functional component (electronic component, first electronic component)
22: Electronic component (second electronic component)
23: Resin molded product
24: Wiring circuit (wire)
30: Inner insulating layer (insulating member, second insulating member)
31: Inner insulating layer (insulating member, insulating member embedded in resin molded body, first insulating member)
40: Temporarily-fixing film (temporarily-fixing member)
51: High frequency functional component (electronic component, first electronic component, tall component)
53 and 66: Opening
62: Metal housing (housing made of metal material)
62a: First box
62b: Second box
63: Insulating layer
64: Potting section (insulating member)
65: Through hole
71: Upper molding die
72: Lower molding die

The invention claimed is:
1. An electronic device comprising:
at least one electronic component;
an electrically conductive member which electromagnetically shields the at least one electronic component;
a resin molded body in which at least part of the at least one electronic component and at least part of the electrically conductive member which electromagnetically shields the at least one electronic component are embedded and fixed;
a first electronic component which is the at least one electronic component that is electromagnetically shielded; and
a second electronic component which is not electromagnetically shielded, wherein:
the second electronic component is at least partially embedded in the resin molded body;
the first electronic component is fixed with an insulating member that is provided in a space surrounded by the electrically conductive member;
at least part of the insulating member is embedded in the resin molded body together with at least part of the first electronic component and at least part of the electrically conductive member;

the electrically conductive member includes a first electrically conductive member which is embedded in the resin molded body, a second electrically conductive member which is not embedded in the resin molded body, and at least one third electrically conductive member which is provided between the first electrically conductive member and the second electrically conductive member;

the first electrically conductive member and the second electrically conductive member are electrically connected with each other via the at least one third electrically conductive member;

an electrode of the first electronic component is connected with an electrode of the second electronic component on a surface of the resin molded body and on a surface of the insulating member, which is embedded in the resin molded body, via wiring connection such that a wire of the wiring connection connecting the electrode of the first electronic component with the electrode of the second electronic component does not contact with the at least one third electrically conductive member; and a part between the wire of the wiring connection and the second electrically conductive member is insulated with an insulating member which is not embedded in the resin molded body or with air.

2. The electronic device as set forth in claim 1, wherein the electrode of the first electronic component and the electrode of the second electronic component are flush with or substantially flush with the surface of the resin molded body.

3. The electronic device as set forth in claim 1, wherein the second electrically conductive member has an opening which is provided immediately above at least one of the first electronic component.

4. The electronic device as set forth in claim 2, wherein the wiring connection is formed by printing with use of an electrically conductive material.

5. A method for producing an electronic device recited in claim 1, said method comprising:

an attaching/temporarily-fixing step of attaching and temporarily fixing at least one electronic component to a temporarily-fixing member;

a first electromagnetically shielding step of covering the at least one electronic component with a first insulating member and a first electrically conductive member so as to electromagnetically shield the at least one electronic component;

a resin molding step of placing the temporarily-fixing member inside a molding die after the first electromagnetically shielding step in a state in which the at least one electronic component, the first insulating member, and the first electrically conductive member are temporarily fixed to the temporarily-fixing member, and carrying out resin molding so that each of the at least one electronic component, the first insulating member, and the first electrically conductive member is at least partially embedded in a resin molded body;

a taking-out step of separating the temporarily-fixing member from the resin molded body which has been made in the resin molding step; and a second electromagnetically shielding step of covering, after the taking-out step, the at least one electronic component with a second electrically conductive member so as to electromagnetically shield the at least one electronic component on a side opposite to a side on which the first electrically conductive member is provided.

6. The method as set forth in claim 5, wherein:

in the attaching/temporarily-fixing step, an electrically conductive thin plate which has electrical conductivity is attached to the temporarily-fixing member;

the method further includes, after the taking-out step and before the second electromagnetically shielding step, a circuit forming step of forming a wiring circuit, which is connected with an electrode of the at least one electronic component, on a surface formed by the resin molded body and the first insulating member such that a wire does not make contact with the electrically conductive thin plate; and in the second electromagnetically shielding step, a second insulating member is stacked on the wiring circuit and the at least one electronic component in a part excluding the electrically conductive thin plate, and then a second electrically conductive member is stacked on a region in which the at least one electronic component is embedded and which includes the electrically conductive thin plate.

7. The method as set forth in claim 6, wherein the first insulating member, the first electrically conductive member, the second insulating member, the second electrically conductive member, and the wiring circuit are formed by ink-jet printing.

8. The method as set forth in claim 6, wherein in the circuit forming step, the wiring circuit is formed by printing wiring by spraying electrically conductive ink.

9. The electronic device as set forth in claim 1, wherein each of the first electrically conductive member and the second electrically conductive member comprises a thin film having a thickness of 1 μm to 10 μm.

10. The electronic device as set forth in claim 1, wherein the at least one third electrically conductive member comprises a metallic member having a thickness of 0.1 mm or more.

* * * * *